July 31, 1973 R. C. G. SWANN ET AL 3,749,610

PRODUCTION OF SILICON INSULATED GATE AND ION IMPLANTED FIELD EFFECT TRANSISTOR

Filed Jan. 11, 1971 2 Sheets-Sheet 1

INVENTORS
RICHARD C. G. SWANN
BY JACK I. PENTON
Stephen A. Young
ATTORNEY

July 31, 1973 R. C. G. SWANN ET AL 3,749,610

PRODUCTION OF SILICON INSULATED GATE AND ION IMPLANTED FIELD EFFECT TRANSISTOR

Filed Jan. 11, 1971 2 Sheets-Sheet 2

INVENTORS
RICHARD C. G. SWANN
BY JACK I. PENTON
Stephen A. Young
ATTORNEY

United States Patent Office 3,749,610
Patented July 31, 1973

3,749,610

PRODUCTION OF SILICON INSULATED GATE AND ION IMPLANTED FIELD EFFECT TRANSISTOR

Richard C. G. Swann, North Palm Beach, and Jack I. Penton, West Palm Beach, Fla., assignors to International Telephone and Telegraph Corporation, Nutley, N.J.

Filed Jan. 11, 1971, Ser. No. 105,291
Int. Cl. H01l 7/54
U.S. Cl. 148—1.5 10 Claims

ABSTRACT OF THE DISCLOSURE

This is a method of manufacturing a metal insulator semiconductor field effect transistor having a source, drain and channel region, and a gate formed over the channel region. The field insulator is first formed on a semiconductor substrate, which substrate is of one conductivity type. A polycrystalline silicon layer is selectively formed over that portion of the insulating layer which overlies the channel region. First and second openings are formed in the insulating layer adjacent to the gate region. The semiconductor body is then subjected to ion implantation of the doping impurities of opposite conductivity type through said openings to form the respective source and drain regions. Electrical contacts are then formed to the source, gate and drain.

BACKGROUND OF THE INVENTION

This invention relates to a method of manufacturing a metal insulator semiconductor field effect transistor having a source, drain and channel region, and a gate formed over the channel region.

It has been found that by fabricating metal insulator semiconductor integrated circuit field effect transistors (MIS IC FET's) using silicon gate technology, that is, substituting polycrystalline silicon to overlie the gate insulator for previously used aluminum, there is a dramatic reduction in threshold voltage $V_T$ (that voltage necessary to be applied to the gate electrode so as to turn the device on) over previous devices which use an aluminum electrode to overlie the gate insulator. However, in silicon gate devices, the gate insulator and polycrystalline silicon overlap the pn junctions which define the source and drain regions, which regions were formed by standard diffusion processes. This overlapping results from the impurity concentrations spreading into the semiconductor body underneath the gate insulator during the formation of the source and drain regions. Because of this overlapping, there results a feedback capacitance between the gate and drain, and the gate and source thereby limiting the high frequency response of the device.

It has been found that manufacturing MIS IC FET's by forming the source and drain regions using an ion implantation technique, that the high frequency response of the devices is improved since the pn junctions for the source and drain regions in the body extend vertically underneath the opening of the oxide layers and do not spread beneath the gate oxide layer itself. This improvement in high frequency response is directly attributable to the reduction in feedback capacitance from the gate to the respective source and drain regions which capacitance is equivalent to the Miller capacitance in an electron tube. However, it has been found that there is no appreciable reduction in gate threshold voltage using the ion implantation techniques. Ion implantation is a technique for doping the silicon wafer and forming the source and drain regions by accelerating dopant impurities such as phosphorus or boron at a high energy—40,000 to 300,000 electron volts and bombarding the silicon wafer target until the dopant ions penetrate to a desired depth, and those areas where ion implantation is not wanted is suitably masked by aluminum or an oxide mask of 12,000 A. so as to absorb the ions.

SUMMARY OF THE INVENTION

It is an object of this invention to obtain an MIS IC FET which has both improved frequency response while at the same time having an improved gate threshold voltage characteristic.

It is a further object of this invention to combine silicon gate and ion implantation technology to improve the gate threshold voltage characteristic and the frequency response of MIS IC FET devices.

According to a broad aspect of this invention, there is provided a method of manufacturing a metal insulator semiconductor field effect transistor having a source, drain and channel region and a gate formed over said channel region, comprising the steps of forming an insulating layer on a semiconductor substrate, said substrate being of one conductivity type, selectively forming a layer of polycrystalline silicon over that portion of said insulating layer which overlies said channel region, forming first and second openings in said insulating layer adjacent said gate region, and subjecting the semiconductor body to ion implantation of doping impurities of opposite conductivity type through said openings to form said respective source and drain regions.

BRIEF DESCRIPTION OF THE DRAWINGS

FIGS. *1a* to *1l* show the various steps of one embodiment in forming a device in accordance with the teachings of this invention.

DESCRIPTION OF THE PREFERRED EMBODIMENTS

Figure 1A:
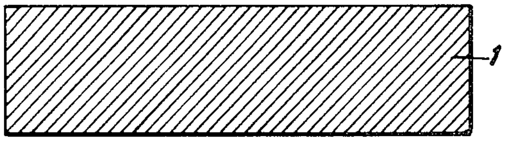
Figure 1B:
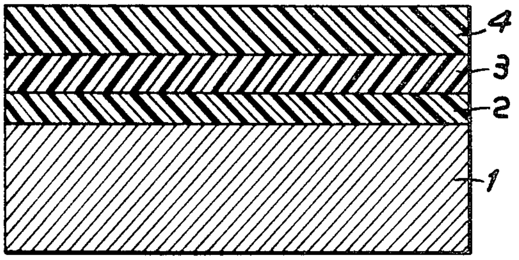
Figure 1C:
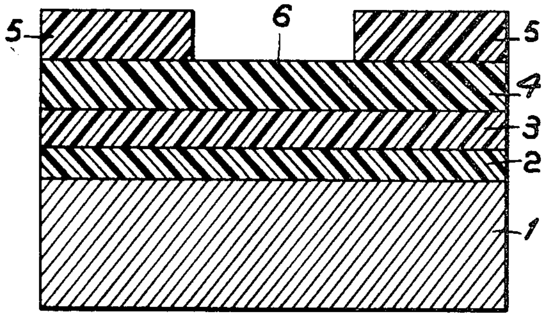

Fabrication of one embodiment of the invention using typical values by way of example only will now be given.

FIG. *1a* shows a starting silicon substrate of N-type conductivity and having a resistivity of 4Ω cm., which may be typically 10 to 12 mils thick, 1¼ inches diameter wafer, said wafer having a 111 crystalline orientation.

Next, a field oxide is formed on the substrate as shown in FIG. *1b*. Layer 2 can be a silicon dioxide layer which is thermally grown over the surface of substrate 1 in a steam atmosphere at approximately 1100° C. until a thickness of about 2,000 A. is grown. Layer 3 can be a silicon nitride layer which is deposited over layer 2 using standard electrodeless glow discharge techniques at approximately 400° C. until a layer of 3,000 A. is formed. Layer 4 is a deposited silicon dioxide layer known in the trade as Silox which is formed over the nitride layer 3 in a well-known manner using silane and oxygen at approximately 455° C. until a layer of approximately 10,000 A. in thickness is deposited.

Figure 1D:
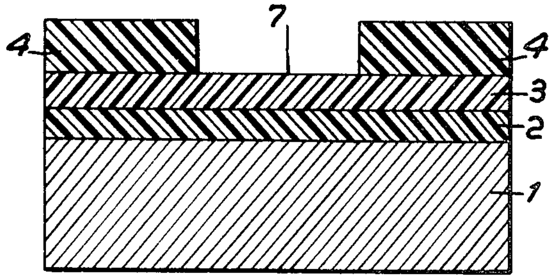
Figure 1E:
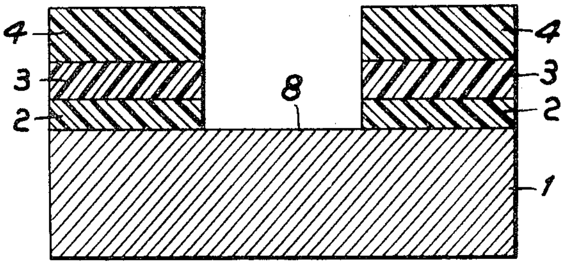
Figure 1F:
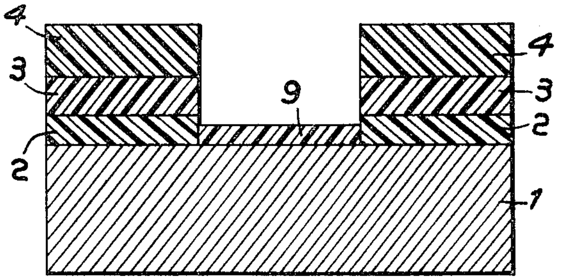

Next a well must be cut in the insulating layers using well-known standard photolithographic techniques and employing photoresists, such as KTFR (Kodak Thin Film Resist) photoresist. A hardened developed photoresist 5 is formed in the well-known standard manner over oxide layer 4 as shown in FIG. *1c*. That portion of the resist pattern which was not developed and removed, exposes portion 6 of oxide layer 4 as shown in FIG. *1c*. A hole is now formed in layer 4 through exposed surface portion 6 using a standard etchant solution such as dilute 13:1 buffered HF so as to expose a portion 7 of nitride layer 3 as shown in FIG. *1d*. Using a standard stripping solution, the hardened KTFR mask 5 is removed as depicted in FIG. 1*d*. Now with the remaining oxide layer 4 providing a mask for the underlying portions of silicon nitride layer 3, a hole is formed in the exposed portion of nitride layer 3 to expose layer 2. One technique for forming this hole is by the standard dip etching of the exposed silicon nitride layer 3 in concentrated hot phosphoric acid at typically 180° C. The remaining oxide layer 4 and nitride layer 3 now serve as a mask to the exposed portion of oxide layer 2. The exposed portion of oxide layer 2 can then be removed by employing the previously described etching techniques using 10:1 buffered HF until a portion 8 of the surface of silicon body 1 is exposed as shown in FIG. 1*e*. A layer of dry silicon dioxide is thermally grown in a water-free oxygen atmosphere in the exposed area of the silicon body to form layer 9 as shown in FIG. 1*f*. This layer is grown at 1150° C. until it reaches a thickness of approximately 1,000 A.

Figure 1G:
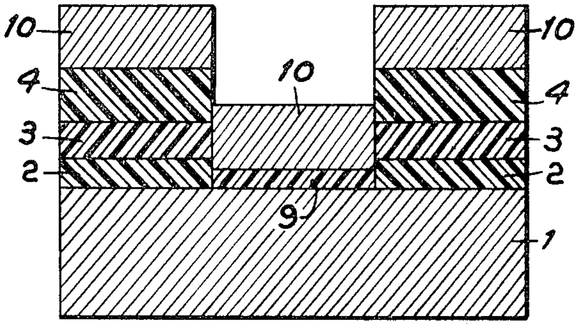

Next a layer of polycrystalline silicon is pyrolytically deposited over the layers 9 and 4 at a temperature of about 680° C. from an atmosphere containing 2% silane in nitrogen and a carrier gas such as hydrogen, until the polycrystalline silicon layer 10, as shown in FIG. 1*g*, reaches a thickness of approximately 7,000 to 8,000 A. At this point, the deposited polycrystalline silicon layer 10 can be doped with a P-type dopant material, such as boron, using well-known standard diffusion techniques in a diffusion furnace. However, for P-channel field effect transistor devices, such as presently being described, this doping and diffusion step may be omitted.

Figure 1H:
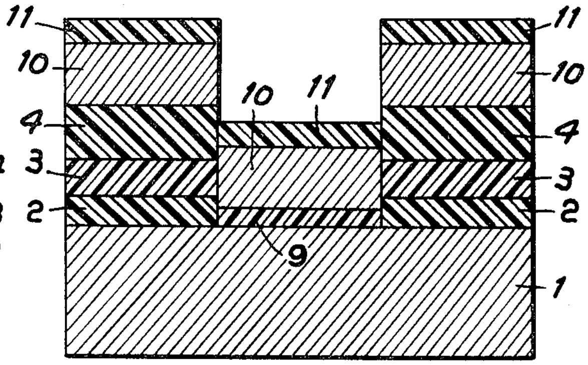

In the next step a layer of Silox 11 as shown in FIG. 1*h* is deposited over previously formed polycrystalline silicon layer 10 to a thickness of about 3,000 to 5,000 A. The deposition of the Silox can take place under the same conditions as previously described for Silox layer 4.

Figures 1I, 1J, 1K, 1L, 2, 3:
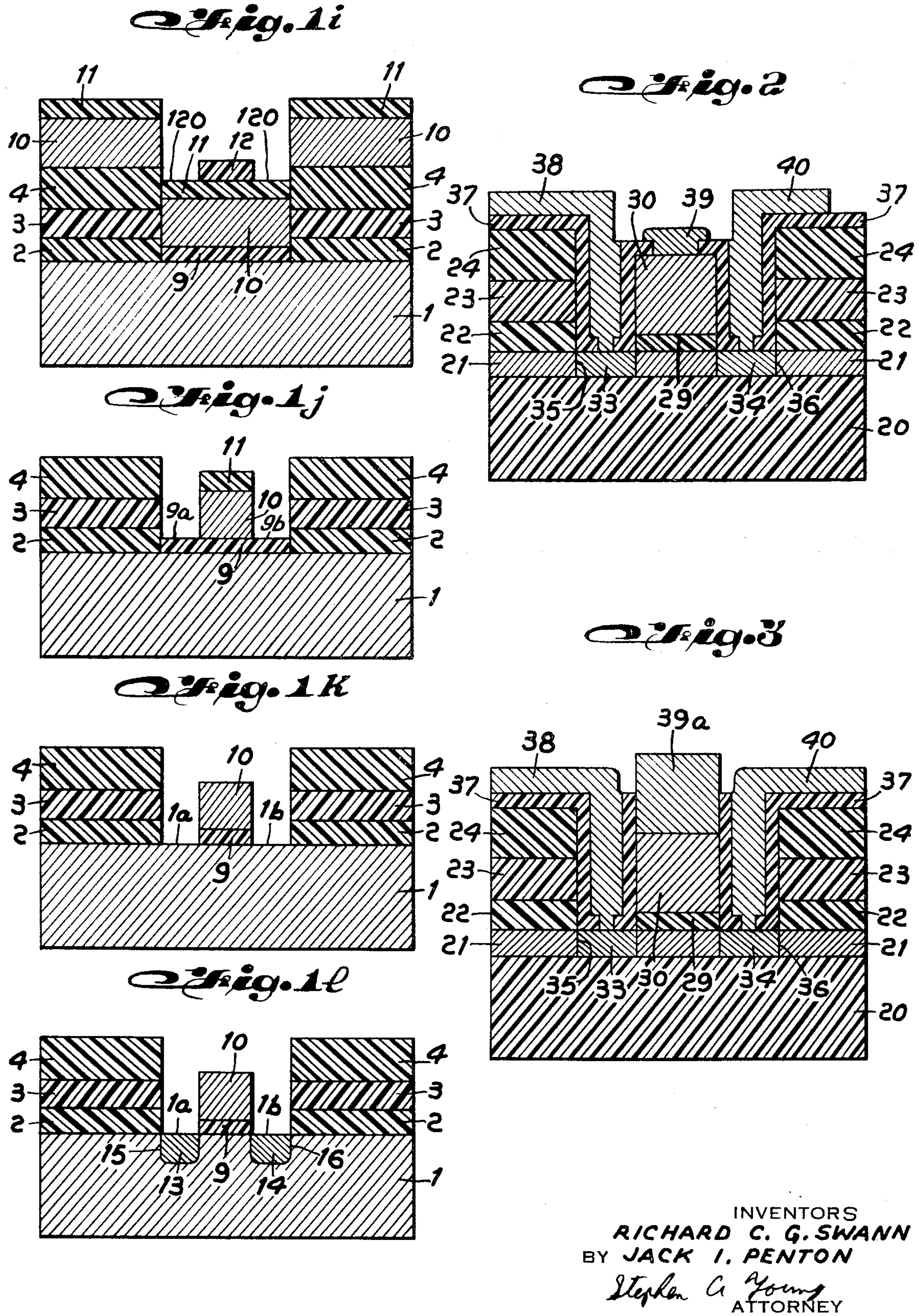
FIG. 2 shows another embodiment of the invention formed on a sapphire substrate.
FIG. 3 is a further embodiment of the invention shown in FIG. 2.

Next using standard photolithographic techniques, the developed KTFR photoresist pattern 12 is centrally formed on that portion of layer 11 within the etched well area 120, as shown in FIG. 1*i*. Now again the exposed area of Silox layer 11 are now removed. This removal can be accomplished using the same previously described etching techniques for Silox, employing dilute 13:1 buffered HF as an etchant solution for the Silox until the underlying portions of polycrystalline layers 10 are exposed. Now the exposed polycrystalline silicon is removed. This can be accomplished by exposing the polycrystalline silicon to an etchant solution having a component concentration, such as 20 parts by volume of water, 50 parts by volume nitric acid, and three parts by volume HF. During the etching of the polycrystalline silicon, the developed KTFR photoresist layer portions 12 float off so as to expose the remaining underlying portion of Silox layer 11. The etching of the polycrystalline silicon, of course, continues until thin oxide layer 9 and those portions of Silox layer 4 are reached, as depicted in FIG. 1*j*. Now the exposed portions 9*a* and 9*b* of dry oxide layer 9 are removed. This removal can occur by using previously discussed standard etching techniques and an etchant solution such as buffered 10:1 HF. This process continues until all of the exposed portions 9*a* and 9*b* of oxide layer 9 are removed so as to expose surface portions 1*a* and 1*b* of substrate 1. This last etching step actually is continued until all of the remaining overlying Silox layer 11 is also removed and, of course, we get a reduction in the thickness of the remaining portions of Silox layer 4. The results of this last step, of course, are depicted in FIG. 1*k*.

Now using an ion implantation machine, such as Model LS5 made by High Voltage Engineering, the slices are placed on a target pedestal within the machine. Using boron trichloride as a source of dopant, the machine provides a source of boron ions which bombard exposed surface portions 1*a* and 1*b* and surface portions of polycrystalline layer 10. Boron being a P-type impurity will penetrate within substrate 1 producing source and drain regions 13 and 14 of P-conductivity type and along with respective PN junctions 15 and 16 which junctions do not underlie remaining oxide layers 2 and 9 as shown in FIG. 1*l*. Typical conditions of bombardment used during the ion implantation step are as follows: The energy level was 150 kev. The dosage or beam current level was 400 $\mu$a.-sec. The target was cooled in liquid nitrogen at −190° C. during bombardment and the angle of bombardment was adjusted to zero to get vertical junctions which do not underlie oxide layers 9 and 2 as previously stated. The scan area in this bombardment was approximately 25 cm.$^2$. During this step, not only were the boron ions implanted into substrate 1 as previously referred to, but they also penetrated into polycrystalline silicon layer 10 which insures that layer 10 is of P-conductivity tape.

Now that device is subjected to an annealing step so as to activate the implanted boron and thus obtain the lowest possible sheet resistance for the boron implanted areas. The annealing in this example was carried out in nitrogen at 535° C. for approximately 30 minutes. The temperature, of course, could have been increased to approximately 820° C. or 850° C. without worrying about the implanted boron appreciably diffusing further into the substrate 1. After these last steps are complete, we then obtain a structure as shown in FIG. 1*l*. The polycrystalline silicon layer 10 is now considered the gate for the formed MIS field effect transistor. In a well-known manner, ohmic contacts can then be applied to source, drain and gate regions.

While the description for the fabrication of the device shown in FIG. 1 merely showed the formation of one field effect transistor, actually, many such devices can be formed simultaneously on one wafer, thereby forming either discrete devices or various numbers of integrated circuit devices interconnected in accordance with the design requirements, which devices would be separated from one another using standard die separation techniques.

In an alternate embodiment of the invention, the previously described technique can be adapted to fabricate devices on a sapphire substrate 20 as shown in FIG. 2. The main difference in this example is that we start with a sapphire substrate and the silicon layer 21 is deposited over the sapphire substrate using standard well-known epitaxial growth techniques until this layer reaches a thickness of, for example, 1 to 5 microns. Since generally epitaxially grown silicon has a high resistivity, in all probability, it would be desirable to diffuse into layer 21 an N-type impurity material, such as phosphorus, to obtain the desired conductivity type and sheet resistivity. After this, the formation of layers 22, 23 and 24 correspond identically to the formation of layers 2, 3 and 4 in FIGS. 1*b* to 1*e*. The steps required to form layers 29 and 30 are virtually identical to those necessary to form layers 9 and 10 as shown in FIGS. 1*f* to 1*k* and the steps necessary in the formation of respective source and drain regions 33 and 34 along with their respective junctions 35 and 36 are identical with those steps corresponding to the explanation associated with source and drain regions 13 and 14 and their respective junctions 15 and 16, as shown in FIG. 1*l*. The basic difference in regions 33 and 34 verses 13 and 14, which are shown in FIG. 1*l*, is that the junctions associated with regions 33 and 34 extend vertically through the total thickness of silicon layer 21 as do regions 33 and 34 themselves. Silican dioxide layer portions 37 are formed to provide for suitable masking in order to make ohmic contacts 38, 39 and 40 to respective source, gate and drain regions 33, 30 and 34. These ohmic contacts, of course, are formed in a standard well-known manner, and generally will consist of aluminum or any other suitable conductive material.

While the examples given for FIGS. 1 and 2 are for P-channel devices, N-channel devices can likewise be formed, as shown in FIG. 3, wherein in this case silicon body 21 is of P-type material. Source and drain regions 33 and 34 were formed by ion bombardment of an N-type impurity material such as phosphorus. However, the only differences in steps of fabrication for an N-channel field effect transistor as shown in FIG. 3 are as follows. During the formation of polycrystalline silicon layer 30, it is necessary to dope this layer with a P-type dopant using standard diffusion techniques which was described previously as an optional step in the formation of the P-channel device. Furthermore, before ion bombardment of N-type material would begin, it would be necessary to deposit an ion bombardment barrier over polycrystalline layer 30. In our example, this barrier can be a layer 39*a* of aluminum which will also serve as the gate electrode for the device herein. All other steps related to the fabrication of this device will be the same as for the devices shown in FIGS. 1 and 2. As an alternative to using aluminum layer 39*a*, silicon dioxide or silicon nitride layers can be formed over layer 30, but if silicon oxide is used, it should be at least 12,000 A. thick so as to form a suitable barrier to ion implantation.

It is to be understood that the foregoing description of specific examples of this invention is made by way of example only and is not to be considered as a limitation on its scope.

We claim:

1. A method of manufacturing a metal insulator semiconductor field effect transistor having a source, drain and channel region, and a gate formed over said channel region, comprising the steps of:

forming a first silicon dioxide layer over the surface of a silicon substrate, said substrate being of one conductivity type;

depositing a silicon nitride layer over said first oxide layer;

depositing a second silicon dioxide layer over said silicon nitride layer;

forming a well within said first and second oxide and said nitride layers to expose a portion of said surface;

forming a third silicon oxide layer on said exposed portion of said semiconductor surface, said exposed portion overlying said channel region;

selectively forming a layer of polycrystalline silicon over said third oxide layer which overlies said channel region;

forming first and second openings in said layer of polycrystalline silicon and said third oxide layer adjacent said gate region; and subjecting the semiconductor body to ion implantation of doping impurities of opposite conductivity type through said openings to form said respective source and drain regions.

2. A method according to claim 1, wherein said first silicon dioxide layer is thermally grown in a steam atmosphere.

3. A method according to claim 2, wherein said first oxide layer is thermally grown at approximately 1100° C. until said layer grows to a thickness of about 2.000 A.

4. A method according to claim 1, wherein said silicon nitride layer is deposited using electrodeless glow discharge techniques at approximately 400° C. until a layer of approximately 3,000 A. is formed.

5. A method according to claim 1, wherein said second silicon dioxide layer is deposited from an atmosphere containing silane and oxygen at approximately 455° C. until said second layer reaches a thickness of approximately 10,000 A.

6. A method according to claim 1, wherein said third oxide layer is thermally grown in a water-free oxygen atmosphere.

7. A method according to claim 6, wherein said third silicon dioxide layer is grown at a temperature of approximately 1150° C. until said third oxide layer grows to a thickness of approximately 1,000 A.

8. A method according to claim 1, wherein said ion implantation occurs at an energy level of 150 kev. and a beam current level of 400 μa.-sec.

9. A method according to claim 8, wherein said body was cooled in liquid nitrogen at approximately —190° C. during said ion implantation step.

10. A method according to claim 9, wherein said ion implantation step is carried out at an angle of bombardment of zero to obtain vertical junctions associated with said source and drain regions.

References Cited

UNITED STATES PATENTS

| | | | |
|---|---|---|---|
| 3,475,234 | 10/1969 | Kerwin et al. | 148—187 |
| 3,413,531 | 11/1968 | Leith | 317—235 |
| 3,413,145 | 11/1968 | Robinson et al. | 148—175 X |
| 3,424,661 | 1/1969 | Androshuk et al. | 148—187 UX |
| 3,419,761 | 12/1968 | Pennebaker | 317—234 |
| 3,576,685 | 4/1971 | Swann et al. | 148—1.5 X |
| 3,596,347 | 8/1971 | Beale et al. | 29—571 |
| 3,576,478 | 4/1971 | Watkins et al. | 317—235 |

OTHER REFERENCES

Bennett: Concise Chemical and Technical Dictionary, Chemical Publishing Co., N.Y., 1962, p. 837.

GEORGE T. OZAKI, Primary Examiner

U.S. Cl. X.R.

148—187; 317—235 B; 29—571